(12) United States Patent
Ellison et al.

(10) Patent No.: US 6,448,796 B1
(45) Date of Patent: Sep. 10, 2002

(54) SELECTIVE NETLIST TO TEST FINE PITCH MULTI-CHIP SEMICONDUCTOR

(75) Inventors: John J. Ellison, Elizaville, NY (US); Chon C. Lei, Poughkeepsie, NY (US); Jorge L. Rivera, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 09/593,557

(22) Filed: Jun. 14, 2000

(51) Int. Cl.[7] .............................................. G01R 31/02
(52) U.S. Cl. ..................................... 324/754; 324/158.1
(58) Field of Search ................................. 324/754, 755, 324/537, 763, 158.1; 714/724, 715, 712, 726

(56) References Cited

U.S. PATENT DOCUMENTS

| | | | |
|---|---|---|---|
| 5,477,160 A | * 12/1995 | Love | ......................... 324/755 |
| 5,872,051 A | 2/1999 | Fallon et al. | |
| 5,924,622 A | 7/1999 | Davis et al. | |
| 5,956,606 A | 9/1999 | Burnette | |
| 6,046,600 A | * 4/2000 | Whetsel | ......................... 324/763 |
| 6,094,056 A | * 7/2000 | Bardsley et al. | ............. 324/754 |
| 6,137,299 A | * 10/2000 | Cadieux et al. | .............. 324/757 |
| 6,262,579 B1 | * 7/2001 | Chazan et al. | ............... 324/537 |
| 6,262,581 B1 | * 7/2001 | Han | ........................... 324/755 |
| 6,323,664 B1 | * 11/2001 | Kim et al. | .................... 324/754 |

* cited by examiner

*Primary Examiner*—Michael Sherry
*Assistant Examiner*—Paresh Patel
(74) *Attorney, Agent, or Firm*—Margaret A. Pepper

(57) ABSTRACT

A system for testing every one of the signal inputs and outputs (I/O) of a fine pitch multi-chip semiconductor module utilizing a selective netlist, through the intermediary of presently available test equipment. More particularly, the system facilitates the testing of fine pitch multi-chip modules utilizing 1.0 mm ceramic column grid array (CCGA) technology in order to facilitate the use of increased system interconnect capabilities. Additionally, there is provided a method of employing a selective netlist in order to test fine pitch multi-chip semiconductor modules; especially such as, but not limited to 1.0 mm pitch ceramic column grid array (CCGA) modules by employing commercially available test equipment.

14 Claims, 2 Drawing Sheets

SELECTIVE NETLIST TO TEST FINE PITCH MULTI-CHIP SEMICONDUCTOR

BACKGROUND OF THE INVENTION

1. Field of the Invention

The present invention relates to a system for testing every one of the signal inputs and outputs (I/O) of a fine pitch multi-chip semiconductor module utilizing a selective netlist, through the intermediary of presently available test equipment. More particularly, the invention is directed to a system which facilitates the testing of fine pitch multi-chip modules utilizing 1.0 mm ceramic column grid array (CCGA) technology in order to facilitate the use of increased system interconnect capabilities. Additionally, the invention is directed to a method of employing a selective netlist in order to test fine pitch multi-chip semiconductor modules; especially such as, but not limited to 1.0 mm pitch ceramic column grid array (CCGA) modules by employing commercially available test equipment.

Semiconductor devices are becoming ever more dense in chip positioning and adjacencies of connections with the evolution of new technologies, and concurrent increases in bus bandwidths to maximize performance of the devices. This in turn, leads to increased functions and increased number of I/O's (inputs/outputs), while simultaneously decreasing the overall size of the chip carrier and substrate. This again, dictates the presence of a much tighter I/O pitch at the chip carrier level in order to accommodate all substrate connection requirements. Typical modules today have moved from the so called "standard" 1.27 mm I/O pitch into the 1.0 mm pitch definition.

Presently produced multi-chip (MCM) products are using 1.0 mm CCGA technology in order to allow for increased system interconnect capability. An example of this type of product is a current mid-range multi-chip semiconductor module which uses 812 signal I/O's (out of 1247 total), on a 32.5 mm×42.5 mm rectangular package. A typical currently available automated test equipment (ATE), usually contains a limited number of tester channels in order to minimize overall testing costs. The expenditures for such test equipment (ATA) are high for just a basic system, and can readily increase to double the cost, once auxiliary features, including additional tester channels, are added thereto. The most common tester configurations contain tester channels of under 384 pins. Thus, decisions must be made as to whether to spend additional capital in order to support the use of higher pitch count testers or, alternatively, to develop new approaches facilitating the utilization of existing testers while still assuring a high degree of fault detection in fine pitch multi-chip modules.

The currently existing 1.27 mm pitch CCGA (ceramic column grid array) technology is not sufficient to be able to provide the necessary solder interconnections of; for example, the Corona module (used in the Pulsar system of the AS/400 mid-range computer) between the chip carrier and the printed circuit board (PBC). As a result, 1 mm CCGA technology is employed for Corona modules which incorporate 1247 solder column connections between the module and card. Before the Corona module is joined to the card, the module must be electrically tested so as to ensure that it is in proper functioning order. For the Corona module, there are 812 signal I/Os (out of the provided 1247) which must be tested with regard to proper interconnections and the preference of any shorts. However, the conventional automatic commercial tester (ATE) has 300 (or possibly even less) channels, which are inadequate to be able to test every signal I/O of Corona modules. On the other hand, it would be very expensive and uneconomical to custom design and fabricate a test board which provides 812 channels so as to be able to test every signal I/O for each respective channel.

2. Discussion of the Prior Art

In essence, although various patent publications are currently in existence with regard to the placement and spacings of fine pitch elements on multi-chip boards (MCM), such as possible 1 mm I/O pitch densities on circuit boards, none of these are in essence, directed to the provision of testing systems and methods utilizing low count pin test equipment which will ensure high module I/O test coverage on high pin count products, such as is employed for the CCGA technology.

Burnette U.S. Pat. No. 5,956,606 discloses a method for bumping and packaging semiconductor die products utilizing fine pitch electrical interconnect structure. There is no disclosure with regard to the utilization of selective netlist to these fine pitch modules for electrical integrity.

Davis et al U.S. Pat. No. 5,924,622 disclose a method and apparatus for soldering ball grid array (BGA) or column grid array (CGA) modules to substrates, and which are arranged in high density, fine pitch patterns.

Fallon et al U.S. Pat. No. 5,872,051 disclose a process of transferring material to semiconductor chip conductive pads using a transfer substrate, wherein fine pitch high density patterns are employed in the spacing of the various pins and connects.

Although the foregoing patent publications generally relate to products using close or dense I/O pitch arrays, these do not address themselves to a method and system of testing every single I/O of a 1 mm fine pitch high density multi-chip module, particularly such as a CCGA module, through the intermediary of currently available and commercial test equipment.

SUMMARY OF THE INVENTION

Accordingly, in order to obviate the need to design and fabricate a customized test board for each fine pitch module, such as the 1 mm pitch CCGA module, the present invention utilizes the concept of grouping multiple signal I/Os from the chip carrier BSM (bottom surface metallurgy) into the same net of the test board which have similar electrical characteristics. Thus, this signal I/O grouping technique reduces the number of required from the tester to test 1 mm pitch CCGA module effectively. However, since multiple signal I/Os from substrate BSM are grouped within the same net, this implies that any "short" between these signal I/O pads are not detected from the tester. Thus, an inspector has to rely on visual inspection (under microscope) to make sure that no solder columns are bridged between any of the signal I/Os within the same net. Rendering it even more difficult, the spacing (0.008 inch) between two 1 mm pitch solder columns is much smaller than the conventional 1.27 mm pitch (0.015 inch). Consequently, there is always a chance that an inspector will not be able to detect the bridging between two 1 mm pitch solder columns, and if these two columns are within the same net, the "short" (solder column bridging) will also not be detected by the test equipment. This will result in shipping a potentially defective module to a customer. In order to prevent this from occurring the present invention provides the novel feature of grouping signal I/Os selectively within the test board such that no adjacent columns are in the same net.

In essence, the invention defines a general approach for fine pitch products which allows for the use of currently available standard low pin count test equipment, while still assuring high module I/O test coverage on high pin count products. This requires an understanding of logic design, an understanding of the tester capabilities (channels) and an understanding of potential I/O defects. Conventional commercial testers typically do not contain enough channels to test for defects for each signal I/O on the product. Grouping I/Os assists in being able to "fit " the device on a given test platform, but selective grouping, taking into account the physical I/O assignments and location, aids in minimizing test escapes to the field. Because of the high number of I/Os and the density of the pins, visual inspections normally do not assure I/O bridging detection.

Accordingly, it is an object of the present invention to enable the testing of every signal I/O on a fine pitch multi-chip module, such as a 1 mm pitch CCGA module, using commercially available test equipment.

BRIEF DESCRIPTION OF THE DRAWINGS

Reference may now be made to the following detailed description of a preferred embodiment of the invention, taken in conjunction with the accompanying drawings; in which.

DETAILED DESCRIPTION OF A PREFERRED EMBODIMENT

Figure 1:
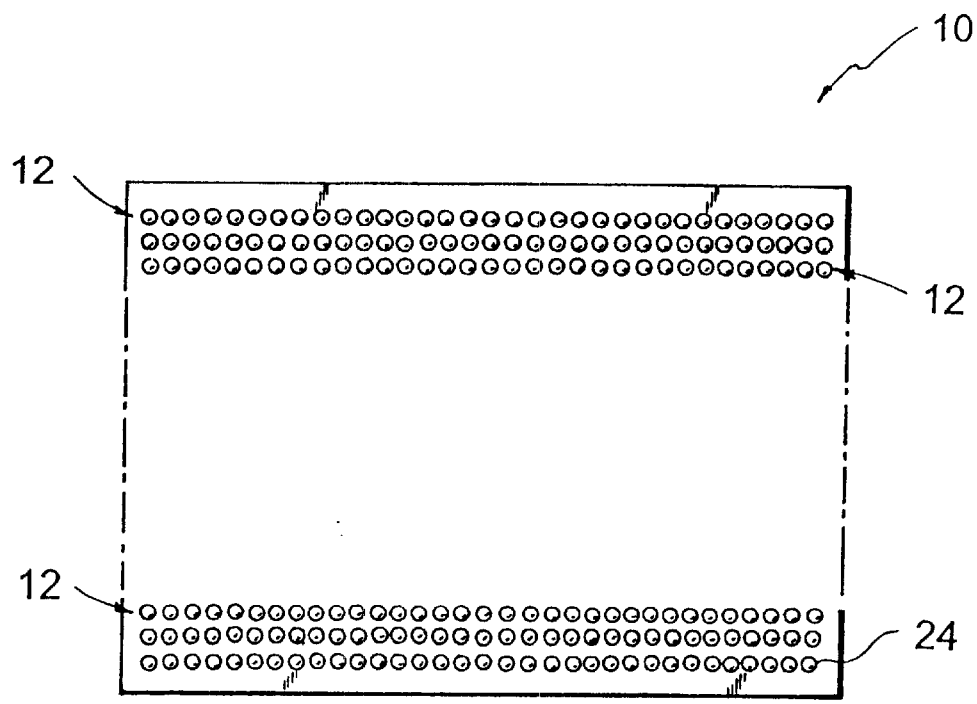
FIG. 1 illustrates a plan view of a 1 mm pitch multi-chip module (MCM)
Figure 2:
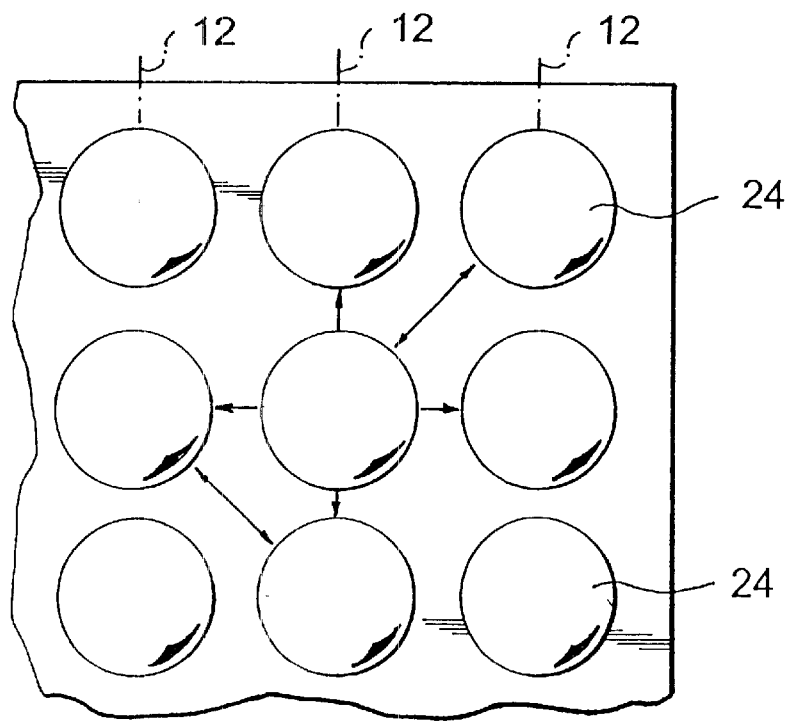
FIG. 2 illustrates, on an enlarged scale, the spacing between adjacent columns of pin arrays which are to be tested.

Referring specifically to the drawing FIG. 1 shows a multi-chip module (MCM) 10 containing 1247 (1 mm pitch) solder column connections 12, is first tested at the land grid array (LGA) level and then at the ceramic column grid array (CCGA) level. As shown in the enlarged detail of FIG. 2, there is a very small distance (8.5 mils) between the two adjacent solder columns 12, due to the fine pitch, and is susceptible to potential electrical bridging (shorts). In order to ensure that these potential defects (shorts) are not present when the product is manufactured, it is necessary to adequately test all of the module inputs/outputs I/Os. Achieving this testing on a platform which contains less then the total signal count of the product (812), requires that the following procedure be followed; referring to FIG. 3:

1) Identify all the types of common module driver 20 which can be grouped together at the tester interface board (TIB) or driver interface board (DIB).

Grouping common drivers allows the parametric tests of the pins 24 to use the same test criteria, and thus have a consistent test for each of the shared pins 24 at the connections 12. In this manner, the test equipment can treat a shared pin 24 as a consistent known entity and does not need to differentiate results based on patterns and type of driver 20. Typical designs tend to use common drivers across large busses and system interfaces, so this grouping is generally likely to be easily performed.

2) Insert logic driver controls 28 in the design to allow only a single grouped driver 20 of a grouping or bank 30 to be active at any given test vector.

Figure 3:
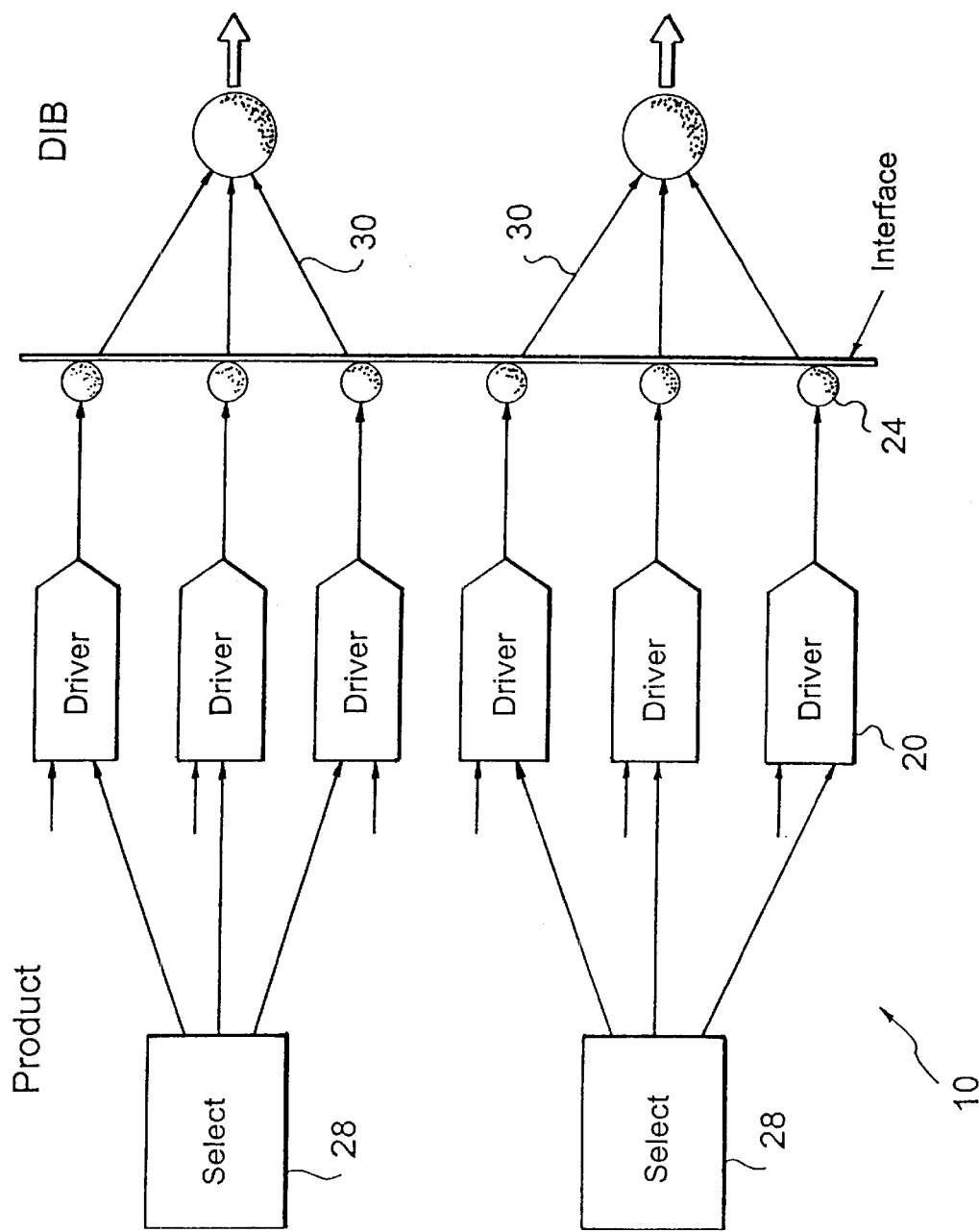
FIG. 3 illustrates, generally diagrammatically, the product to device interface board (DIB) interface with DIB dotting, wherein the product side reflects the controlled driven selections and the DIB shows the selective dotting.

Inserting driver logic controls 28 is done at the chip design level (prior to manufacturing build submission), and requires I/O bank logic to uniquely control selected banks 30 of I/O drivers 20 (as in FIG. 3). Taking the groups of common drivers into account, a suitable number of drivers are provided to facilitate an enable control function so as to allow specific control of any given driver bank 30. This design is then used to uniquely control the driver banks, when test vectors are created, by allowing selectively enabling drivers banks, and to control the number of I/Os which are switched for testing.

3) Check the physical module I/O placement so as not to allow any vertical or horizontal connection or pin column grouping.

This may be interactive with step 2) hereinabove, depending upon any module 10 wiring tradeoffs. It has been determined that there is no need to restrict the diagonal placement since those columns are not as physically close as the row/column adjacencies. Also, this may be potentially implemented at the chip C4 controlled collapse chip connection level to minimize any potential C4 bridging. Checking the physical I/O placement tends to be a shared process with the driver control definitions (Step 2). This is because there is an ongoing tradeoff of internal chip wiring to control the I/O banks, and for determining which physical I/Os are controlled. For example, chip wiring will tend to wire to adjacent drivers 20 since that would be the shortest route. However, physically adjacent drivers also tend to feed physically adjacent I/Os, which may be directly counter to the present approach. Modifications to the design wiring or to the physical I/O placement can readily resolve most of these types of concerns.

4) Device interface board (DIB) design layout accommodates the shared module layout.

Once the module I/Os are grouped, the DIB design must then match the device dotting assumptions. This effort requires not only a device netlist, but also all the dotting assumptions made in the design including all the controls required to activate the driver banks 30. This effort is usually the result of an ongoing discussion between the chip designer and the test community. Adequate communications are vital to assure the success of the testing approach. It is also noted that any dotting changes will likely require DIB modifications as well, and thus the communications between the test and design functions must continue for any chip engineering change (EC)or any design modification.

Once the chip and DIB designs are completed, the product then has test vectors generated for the dotted configuration. The device controls are used to selectively enable each of the driver banks 30 and allow for the tester to channel any of the shared pins 24 to a given tester resource. Which driver banks to enable and how many, are determined by the tester resources and capabilities and will vary depending upon the product.

Although this novel testing approach specifically addresses CCGA products, the approach is applicable to any fine pitch product. CCGA (or any column type of connection) is more likely to bridge than a flat connection, and thus the reason the invention is addressed to this particular product set. Any product can utilize this approach given the chip design modifications and the close partnership between the design and test communities.

While the invention has been particularly shown and described with respect to preferred embodiments thereof, it will be understood by those skilled in the art that the foregoing and other changes in form and details may be made therein without departing form the spirit and scope of the invention.

What is claimed is:

1. A method for testing the electrical integrity of every signal input and output (I/O) connection of a fine pitch multi-chip semiconductor module, said method comprising:
   a) providing a multi-chip semiconductor module having a plurality of semiconductor chips attached thereto and having a plurality of signal I/O connections;
   b) providing a tester interface board having a plurality of connections, wherein the number of tester interface board connections is less than the number of module signal I/O connections;
   c) identifying at least one group of drivers of a common type on one or more of said semiconductor chips;
   d) inserting at least one logic driver control in said semiconductor chips enabling each driver within said at least one group of drivers to be activated sequentially;
   e) connecting each of said drivers to a different one of said module I/O connections, thereby defining at least one group of I/O connections corresponding to said at least one group of drivers, wherein the I/O connections within each of said at least one group of I/O connections are physically placed on said module such that none of the I/O connections within said group of I/O connections are horizontally or vertically adjacent; and
   f) connecting each of the I/O connections within said at least one group of I/O connections to the same one of the tester interface board connections, thereby defining at least one shared tester interface board connection for each of said at least one group of I/O connections.

2. A method as claimed in claim 1, wherein said step e) is interactive with said step d) in dependence upon multi-chip module wiring tradeoffs.

3. A method as claimed in claim 1, wherein said fine pitch of the I/O connections is approximately 1 mm.

4. A method as claimed in claim 1, wherein said multi-chip module comprises a 1.0 mm pitch ceramic column grid array (CCGA) module.

5. A method as claimed in claim 1, wherein said multi-chip module comprises between 812 and 1247 signal I/O connections arranged in vertical and columnar configuration on a rectangular carrier substrate.

6. A method as claimed in claim 1, wherein said group of drivers of a common type enable parametric testing of pins forming said I/O connections so as to provide consistent test data for each of the pins which are connected to said shared tester interface board connection.

7. A method as claimed in claim 1, wherein said at least one logic driver control is correlated with said at least one shared tester interface board connection.

8. A system for testing the electrical integrity of every signal input and output (I/O) connection of a fine pitch multi-chip semiconductor module, said system comprising:
   a) a multi-chip semiconductor module having a plurality of semiconductor chips attached thereto and having a plurality of signal I/O connections;
   b) a tester interface board having a plurality of connections, wherein the number of tester interface board connections is less than the number of module signal I/O connections;
   c) at least one group of drivers of a common type on one or more of said semiconductor chips;
   d) at least one logic driver control in said semiconductor chips enabling each driver within said at least one group of drivers to be activated sequentially;
   e) each of said drivers connected to a different one of said module I/O connections, thereby defining at least one group of I/O connections corresponding to said at least one group of drivers, wherein the I/O connections within each of said at least one group of I/O connections are physically placed on said module such that none of the I/O connections within said group of I/O connections are horizontally or vertically adjacent; and
   f) each of the I/O connections connected within said at least one group of I/O connections to the same one of the tester interface board connections, thereby defining at least one shared tester interface board connection for each of said at least one group of I/O connections.

9. A system as claimed in claim 8, wherein said element e) is interactive with said element d) in dependence upon multi-chip module wiring tradeoffs.

10. A system as claimed in claim 8, wherein said fine pitch of the I/O connections is approximately 1 mm.

11. A system as claimed in claim 8, wherein said multi-chip module comprises a 1.0 mm pitch ceramic column grid array (CCGA) module.

12. A system as claimed in claim 8, wherein said multi-chip module comprises between 812 and 1247 signal I/O connections arranged in vertical and columnar configuration on a rectangular carrier substrate.

13. A system as claimed in claim 8, wherein said group of drivers of a common type enable parametric testing of pins forming said I/O connections so as to provide consistent test data for each of the pins which are connected to said shared tester interface board connection.

14. A system as claimed in claim 8, wherein said at least one logic driver control is correlated with said at least one shared tester interface board connection.

* * * * *